(12) United States Patent
Emberling (10) Patent No.: US 7,089,369 B2
(45) Date of Patent: Aug. 8, 2006

(54) METHOD FOR OPTIMIZING UTILIZATION OF A DOUBLE-DATA-RATE-SDRAM MEMORY SYSTEM

(75) Inventor: Brian D. Emberling, San Mateo, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 272 days.

(21) Appl. No.: 10/403,843

(22) Filed: Mar. 31, 2003

(65) Prior Publication Data
US 2004/0193834 A1 Sep. 30, 2004

(51) Int. Cl.
*G06F 12/00* (2006.01)
(52) U.S. Cl. .................. 711/137; 711/167; 345/543
(58) Field of Classification Search ........... 711/167, 711/154, 137; 345/543
See application file for complete search history.

(56) References Cited

U.S. PATENT DOCUMENTS 6,725,347 B1 * 4/2004 Yang et al. .................. 711/167
2004/0080512 A1 * 4/2004 McCormack et al. ....... 345/543

* cited by examiner

*Primary Examiner*—Kevin L. Ellis
*Assistant Examiner*—Duc T Doan
(74) *Attorney, Agent, or Firm*—Meyertons Hood Kivlin Kowert & Goetzel, P.C.; Jeffrey C. Hood (57) ABSTRACT

A predictive memory performance optimizing unit for use with an interleaved memory, for example a DDR SDRAM memory, and suitable for use in a computer graphics system, among others, is described. The unit maintains a queue of pending requests for data from the memory, and prioritizes precharging and activating interleaves with pending requests. Interleaves which are in a ready state may be accessed independently of the precharging and activation of non-ready interleaves. The unit utilizes idle cycles occurring between consecutive requests to activate interleaves with pending requests.

22 Claims, 5 Drawing Sheets

METHOD FOR OPTIMIZING UTILIZATION OF A DOUBLE-DATA-RATE-SDRAM MEMORY SYSTEM

BACKGROUND OF THE INVENTION

1. Field of the Invention

This invention relates generally to the field of digital interface design and, more particularly, to memory management design in a graphics system.

2. Description of the Related Art

With each new generation of graphics system, there is more image data to process and less time in which to process it. This consistent increase in data and data rates places additional burden on the memory systems that form an integral part of the graphics system. Attempts to further improve graphics system performance are now running up against the limitations of these memory systems in general, and memory device limitations in particular.

One example of a memory sub-system defining the upper limit of overall system performance may be the texture buffer of a graphics system. Certain graphics applications such as 3D modeling, virtual reality viewers, and video games may call for the application of an image to a geometric primitive in lieu of a procedurally generated pattern, gradient or solid color. In these applications, geometric primitives carry additional mapping data (e.g., a UV, or UVQ map), which describes how the non-procedural data is to be applied to the primitive. To implement this type of function, a graphics system may employ a texture buffer to store two dimensional image data representative of texture patterns, "environment" maps, "bump" maps, and other types of non-procedural data.

During the rendering process, the mapping data associated with a primitive may be used to interpolate texture map addresses for each pixel in the primitive. The texture map addresses may then be used to retrieve the portion of non-procedural image data in the texture buffer to be applied to the primitive. In some cases (e.g., photo-realistic rendering) a fetch from the texture buffer may result in a neighborhood or tile of texture pixels or texels to be retrieved from the texture buffer and spatially filtered to produce a single texel. In these cases, four or more texels may be retrieved for each displayed pixel, placing a high level of demand on the texture buffer. Thus, poor performance of the texture buffer is capable of affecting a cascading degradation through the graphics system, stalling the render pipeline, and increasing the render or refresh times of displayed images.

Therefore, the design of memory systems and memory management plays a significant role in the implementation of new generation graphics systems. In some cases, Dynamic Random Access Memory (DRAM) or Synchronous DRAM (SDRAM) devices may be used to implement a texture buffer as they are generally less expensive and occupy less real estate than Static Random Access Memory (SRAM) alternatives. However, factors inherent in DRAM devices, and bus protocols, such as pre-charge time, activation time, refresh period, and others may complicate integration into high bandwidth applications such as high performance graphics systems. One example of a DRAM system that may be used in new generation graphics systems is a Double Data Rate SDRAM (DDR SDRAM) system. DDR SDRAM systems increase the throughput of DRAM memories, but they have not overcome all of the performance hurdles mentioned above.

Figure 1:
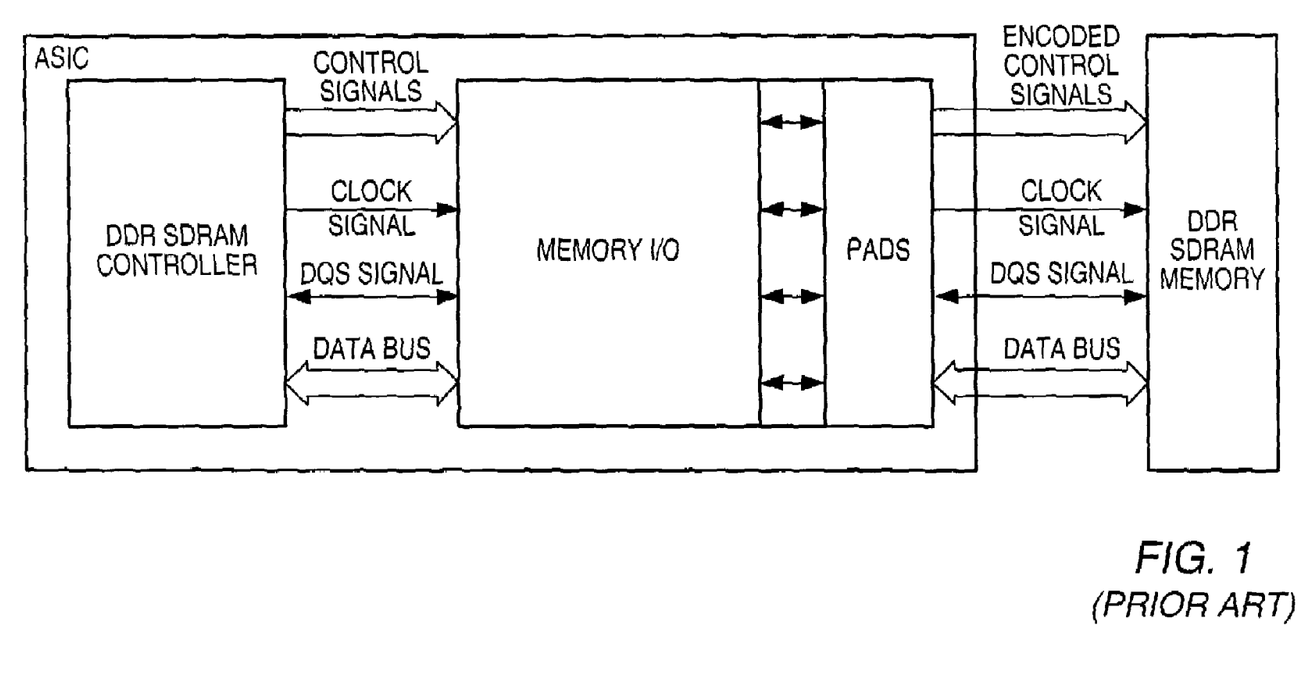
FIG. 1 illustrates a DDR SDRAM system configured in accordance with prior art.

FIG. 1 illustrates a common implementation of a DDR SDRAM system comprising a DDR SDRAM Controller coupled to a DDR SDRAM unit through an interface unit (Memory I/O). The Memory I/O is coupled to the DDR SDRAM unit through a set of pad circuits. In a DDR SDRAM, read-data is accompanied by a corresponding trigger signal, commonly referred to as a DQS signal. The DQS signal is commonly used by a host system, which may include an Application Specific Integrated Circuit (ASIC) coupled to the DDR SDRAM through an interface unit such as the Memory I/O, to sample and latch the read-data Economically, the use of DRAM devices, such as DDR SDRAM, in graphics systems is still desirable, and possible if the above-mentioned performance limiting factors can be mitigated through consideration of certain characteristics unique to graphics systems, such as memory bandwidth having a higher priority than memory latency. For these reasons, a system and method for optimizing the utilization of DRAM memory subsystems, more particularly DDR SDRAM systems, as employed in graphics systems is desired.

SUMMARY

The problems set forth above may at least in part be solved in some embodiments by a system or method for optimizing a DDR SDRAM memory system through the employment of an optimizer module comprising a FIFO buffer and a look-ahead logic circuit, coupled to a DDR SDRAM memory controller. In one embodiment, the memory controller is also coupled to an interleaved memory comprising DDR SDRAM devices operable to receive, store, and recall memory data. Memory "interleaves" may also be referred to as memory "banks". The FIFO buffer may be operable to receive and store pending read-requests for data from the memory. A read-request may be considered a memory command. The pending read-requests may be issued every other clock cycle. In other words, there may be an idle clock cycle (a clock cycle during which no command is issued) following a cycle in which a pending read-request is issued. The FIFO buffer may be operable to transmit a pending read-request to the memory controller during a non-idle clock cycle. The look-ahead logic circuit may be operable to execute a look-ahead algorithm during the idle clock cycle.

In one embodiment, the look-ahead algorithm analyzes each pending read-request presently stored in the FIFO buffer and determines which pending read-requests would result in a page hit and which pending read-requests would result in a page miss if transmitted to the memory controller without any additional commands or instructions, considering the current state of each memory bank. The look-ahead algorithm may also select and transmit an additional memory command to the memory controller. In one embodiment, the look-ahead algorithm selects the additional memory command from a lookup table. Each entry in the lookup table may be a suggested optimal memory command corresponding to a respective sequence of contiguous pending read-requests residing in the FIFO buffer, where the respective sequence is uniquely defined by which pending read-requests in the respective sequence would result in a page miss and which pending read-requests in the respective sequence would result in a page hit. In one embodiment, each entry in the lookup table is determined by performing an exhaustive search on each entry's corresponding respective sequence, where possible combinations of inputs and outputs for the respective sequence are examined and an optimal combination is selected. The optimal combination may determine which additional memory commands would result in the lowest number of clock cycles required by the memory controller to collectively process all pending read-requests in the respective sequence. The memory controller may suspend a transmitting of read-requests and/or additional memory commands by the optimizer module during a time period when the memory controller is servicing a page miss. Similarly, the memory controller may enable the transmitting of read-requests and/or additional memory commands by the optimizer module when the memory controller is not servicing a page miss.

Thus, various embodiments of the invention may provide a means for optimizing an DDR SDRAM memory system containing interleaved DDR SDRAM memory devices through the employment of an optimizer module comprising a FIFO buffer and a look-ahead logic circuit. In one embodiment, the method includes maintaining a list of pending read-requests for data from the memory in the FIFO buffer. Pending read-requests may arrive to the FIFO buffer every other clock cycle, with an idle clock cycle following a cycle in which a pending read-request was received by the FIFO buffer. The look-ahead logic circuit may execute a look-ahead algorithm during an idle cycle. The look-ahead algorithm may select and transmit an additional memory command to the memory controller. The additional memory command may be an entry retrieved from a lookup table based on an examination of all pending read-requests residing in the FIFO buffer and the state of the memory banks. In one embodiment, the transmitting of the additional memory command results in a reduced number of clock cycles required by the memory controller to collectively handle all pending read-requests it receives from the FIFO buffer.

BRIEF DESCRIPTION OF THE DRAWINGS

A better understanding of the present invention can be obtained when the following detailed description is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, a "trigger" signal is defined as a signal that is used to initiate an event or a sequence of events in a digital system. A trigger signal is said to be in a "triggering state" at a time when it initiates a desired event, or sequence of events. A periodic trigger signal may commonly be referred to as a "clock". In a "synchronous" digital system, generally a clock, commonly referred to as a "system clock", may be used for initiating most events, or sequences of events. An example of a triggering state may be a rising edge of a clock in a synchronous digital system. When an event, or a sequence of events, is said to be initiated "in response to" receiving a stimulus signal, it may be implied that the event, or the sequence of events, is initiated as a result of a combination of a trigger signal, used in triggering the event or sequence of events, being in a triggering state at a time when the stimulus signal is asserted. In one set of embodiments, the sending of a pulse through an output port may indicate a point in time at which a leading edge of the pulse occurs at the output port, and the receiving of a pulse through an input port may indicate a point in time at which a leading edge of the pulse occurs at the input port. "FIFO" stands for "first in first out". Entries in a FIFO buffer are output in a same order in which the entries were received and stored by the FIFO buffer. A "subset" of a group of elements may include any number of elements from the group, or all elements of the group.

The term "bus" is used to refer to a plurality of signals or conductors that may be used to transfer one or more of various types of information, such as data, addresses, control, or status. "Burst length" is used to refer to a number that indicates how many consecutive data bus transfers may be performed in response to a single bus transfer request (read-request) sent by a host system. For example, if a burst length is four and a memory read operation is performed, there may be four consecutive sets of data transferred on the data bus in response to a single read signal pulse sent by a host system. The size of a set of data for a single transfer over a data bus is typically commensurate with the size of the data bus. Common burst lengths for a DDR SDRAM may include the values of two, four or eight.

Figure 2:
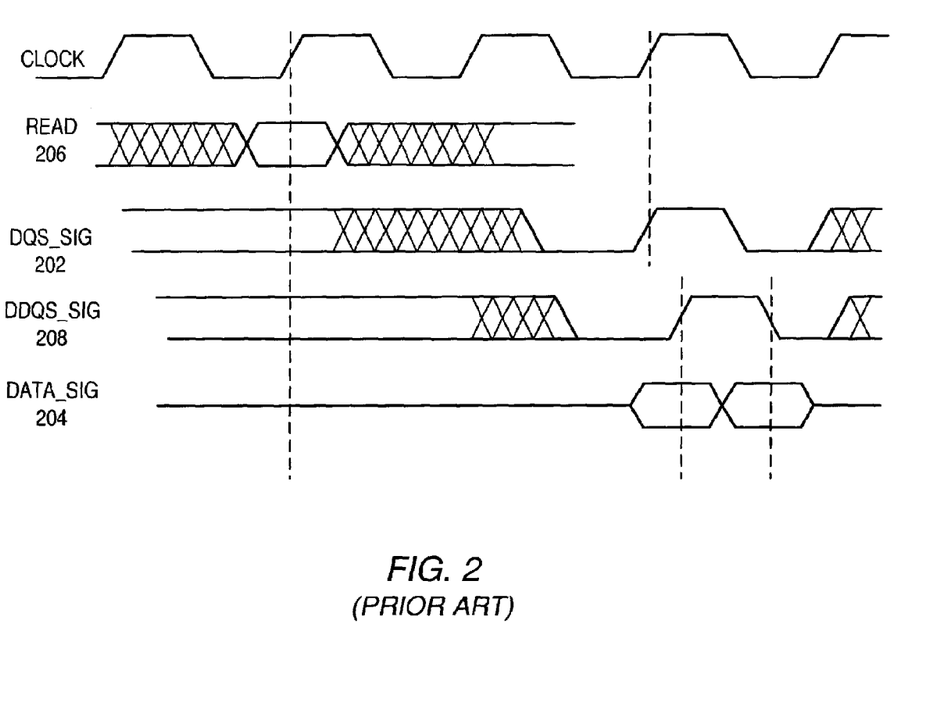
FIG. 2 illustrates a timing relationship between a read signal, a DQS signal, a delayed version of the DQS signal, and a data bus signal during a DDR SDRAM read operation in accordance with prior art.

According to prior art, a read operation for a DDR SDRAM may be performed as follows. A host system, which may be an ASIC that may include a DDR SDRAM controller and an interface unit, sends out a single read-request. The DDR SDRAM receives the read-request through a set of control signals. A predetermined number of clock cycles after having received the read-request, the DDR SDRAM sends a predetermined number of consecutive DQS signal pulses back to the host system. The predetermined number of clock cycles may be referred to as "CAS latency", where CAS stands for "Column Address Strobe". The number of consecutive DQS signal pulses may be commensurate with one half the value of a predetermined burst length for the read operation. The DDR SDRAM also sends a predetermined number of sets of data to the host system, where the number may be commensurate with the value of the predetermined burst length for the read operation. A timing relationship between a Read request (READ) 206, a DQS signal (DQS_SIG) 202, the DQS signal delayed by a quarter clock cycle (DDQS_SIG) 208 and data signal (DATA_SIG) 204 for the read operation is shown in FIG. 2, wherein for the purposes of illustration the burst length and the CAS latency have both been assigned a value of two. In case of a DDR SDRAM system, "page miss" is defined as a response to a memory read-request by a memory controller where the memory controller is liable to perform additional memory operations including, but not limited to, an "activate" and/or a "precharge", before it is capable of accessing and returning data requested by the memory read-request.

A graphics memory may supply a stream of read-requests to a memory system such as a DDR SDRAM memory system. It is usually expected that these read-requests be serviced and/or fulfilled at the highest possible bandwidth to maintain peek performance. Because there is typically no dependency between processed pixels, latency does not play an important factor when considering servicing of these read-requests. The read-requests may reference different internal banks and rows within the memory, which may cause page misses to occur. For example, if a read-request is made to a row in an inactive bank, the inactive bank will first have to be activated before the row may be accessed. Similarly, when consecutive read-requests are made to different rows, respectively, in an active bank, one of the rows will not be accessible as only one row may be active at a time in a single bank. In this case, to gain access to the yet inactive row, the bank will first have to be precharged (in order to deactivate it), and then activated for the desired row, in order for that row to become accessible for fulfilling the respective read-request.

Figure 3A:
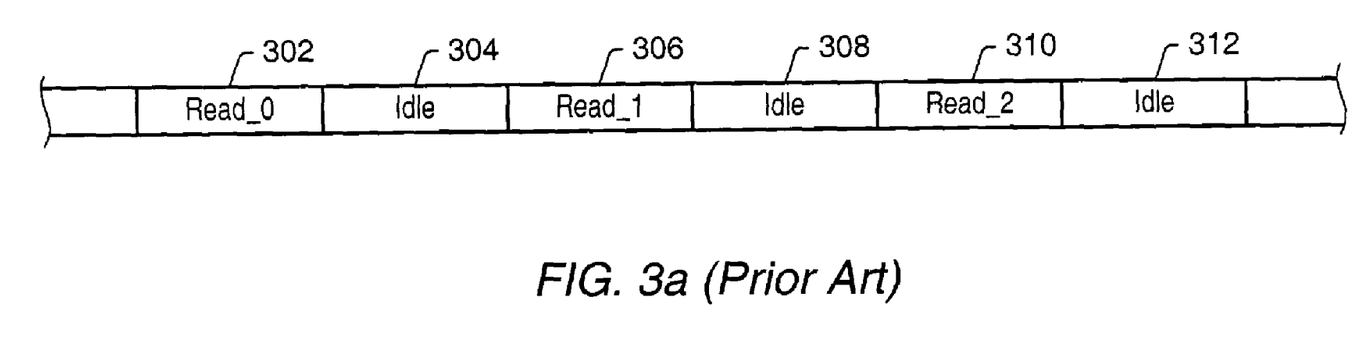
FIG. 3 is a sequence diagram illustrating a possible sequence of successive memory read-requests sent to a DDR SDRAM memory controller, with burst length set to four, in accordance with prior art.
Figure 3B:
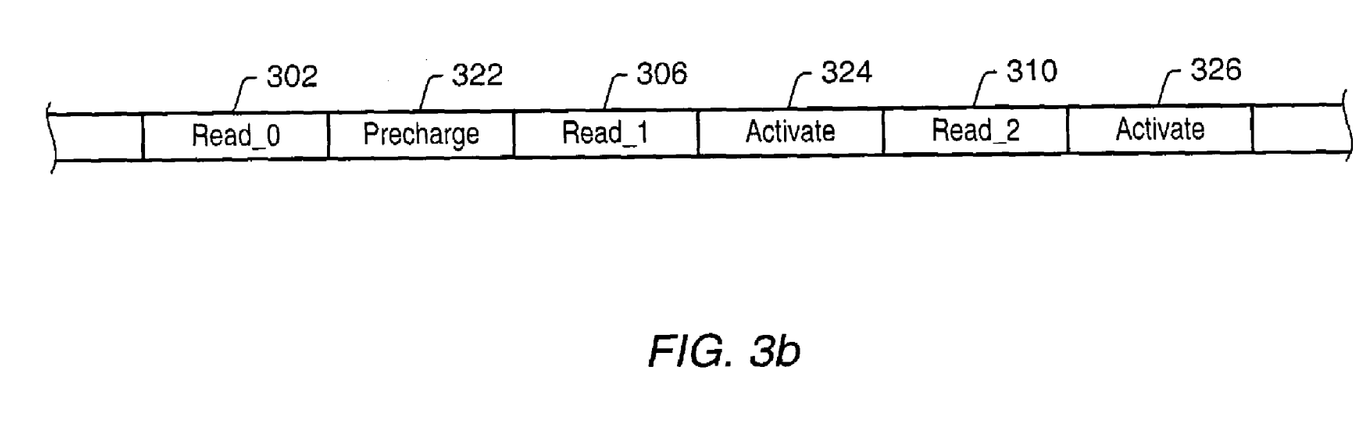

In a DDR SDRAM memory system, if burst length is set to four, subsequent read-requests may not be issued on consecutive clock cycles if the memory is expected to return all four sets of data associated with each single read-request. In other words, there may be at least one idle clock cycle between clock cycles during which subsequent read-requests are issued. It is important to clarify that the read-requests are issued on a control bus, which is separate from a data bus. The idle clock cycles mentioned above refer to idle clock cycles appearing on the control bus while the data bus is constantly in use. The sequence diagrams in FIG. 3a and in FIG. 3b are in reference to the control bus. FIG. 3a shows a sequence diagram illustrating a possible scenario of subsequent read-requests being sent to a memory controller in a DDR SDRAM system, for a burst length equaling four. In this scenario the number of idle clock cycles between subsequent read-requests is kept to an allowed minimum of one. Read-requests Read_0 302, Read_1 306 and Read_2 310 are each followed by idle cycles 304, 308 and 312, respectively. Any one or more of read-requests 302, 306, and 310 could result in a page hit or a page miss. The number of idle clock cycles may increase if the aforementioned conditions are to be observed for a burst length that is greater than four. For example, for a burst length of eight, if the memory is expected to return all eight sets of data associated with a single read-request, then the minimum number of idle clock cycles between clock cycles during which subsequent read-requests are issued increases to three. In its preferred embodiments, the present invention seeks to utilize idle clock cycles that occur between issuance of subsequent read-requests (as described above) to a memory controller, by inserting and transmitting additional memory commands to the memory controller during the idle clock cycles. The additional memory commands—not originating from a host system—when processed by the memory controller, may reduce the number of cycles required by the memory controller to process a sequence of read-requests that were originally issued by the host system. FIG. 3b shows a command sequence illustrating possible insertion of additional memory commands, which in this case are precharge and activate commands, during the idle clock cycles 304, 308, and 312 (from FIG. 3a). Precharge command 322, and activate commands 324 and 326 may be transmitted between read-request commands 302, 306, and 310, respectively, as shown in the command sequence of FIG. 3b.

Figure 4:
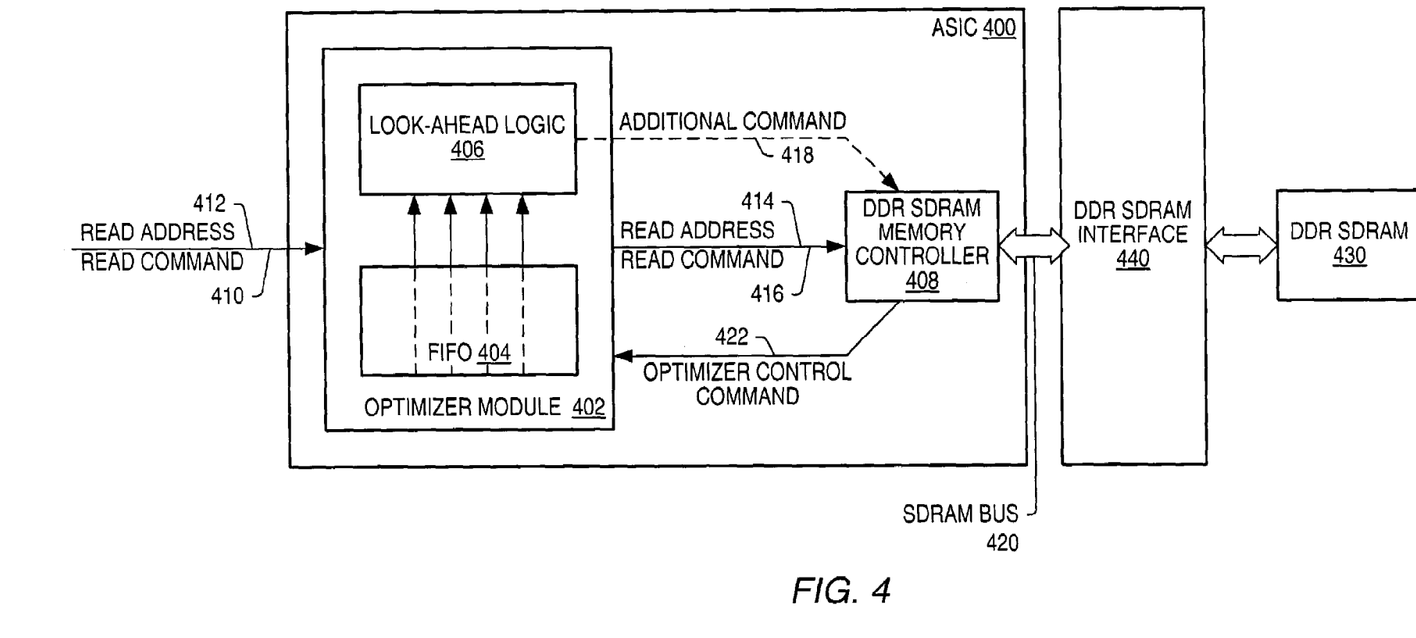
FIG. 4 illustrates a memory optimizer system for a DDR SDRAM system implemented in accordance with one set of embodiments of the present invention.

FIG. 4 illustrates a memory optimizer system implemented in accordance with one set of embodiments of the present invention. In one embodiment, optimizer module 402 is coupled to DDR SDRAM memory controller 408, which is coupled to DDR SDRAM memory 430 through DDR SDRAM interface 400, where optimizer module 402 and memory controller 408 are part of ASIC 400. Optimizer module 401 may intercept read command 410 and associated read address 412 both issued by a host system and intended to reach memory controller 408. In one embodiment, optimizer module 402 contains FIFO buffer 404 coupled to look-ahead logic block 406. Read command 410 may be stored in FIFO 404 where optimizer module 402 may maintain a list of pending read commands, each with its associated read address. Optimizer module 402 may transmit each pending read command 416 and associated read address 414 from FIFO 404 to memory controller 408. In one embodiment, read commands 416 and read addresses 414 are transmitted in a manner similar to that shown in FIG. 3a. For example, if a burst length of four is set, a read command 416 and a read address 414 may be transmitted every other clock cycle (referring to FIG. 3b, read commands 302, 306, and 310), ensuring read-data moving at a peak data-bus rate, with an understanding that all four sets of data associated with a single read request are received from memory 430 by memory controller 408 for each read command 416.

In case read command 416 results in a page miss when processed by memory controller 408, memory controller 408 may suspend optimizer module 401 outputting any more read commands (or any other commands) until memory controller 408 has finished servicing the page miss. However, FIFO 404 may still receive read commands 410 and read addresses 412 while optimizer module 401 is not outputting commands, until FIFO 404 is full. Optimizer module 402 may also transmit additional memory command 418 to memory controller 408. In one embodiment, look-ahead logic block 406 performs a look-ahead algorithm during each idle clock cycle (illustrated cycles 304, 308 and 312 in FIG. 3a), where the algorithm considers all pending read commands that reside in FIFO 404 and considers which banks and rows of memory 430 are active to determine if additional memory command 418 should be sent to memory controller 408 during the idle clock cycle (illustrated commands 322, 324, and 326 in FIG. 3b).

Figure 5:
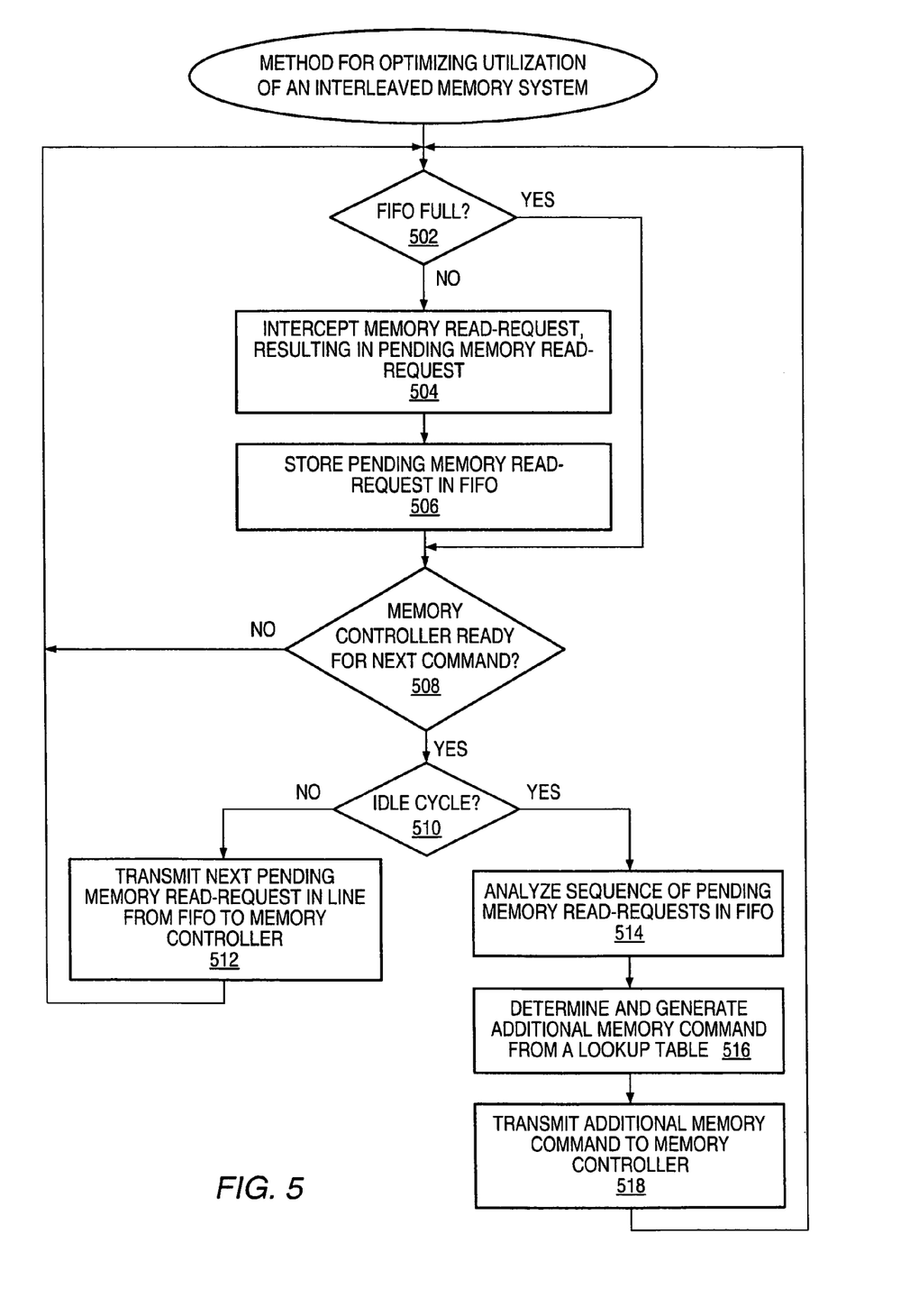
FIG. 5 illustrates part of a method for optimizing utilization of an interleaved memory system implemented in accordance with one set of embodiments of the present invention.

FIG. 5 illustrates a method for optimizing utilization of an interleaved memory system in accordance with one set of embodiments of the present invention. Components used in implementing the method in FIG. 5 may be similar to the system components referred to in FIG. 4. In one embodiment, the method includes maintaining a FIFO (502) (such as FIFO 404 in FIG. 4), which may be part of an optimizer module (such as optimizer module 402 in FIG. 4), and if the FIFO is not full, a memory read-request sent by a host system to a memory controller (such as memory controller 408 in FIG. 4) is intercepted (504) and stored in the FIFO (506). This may result in a sequence of pending memory read-requests in the FIFO (504). If the memory controller is ready to receive commands (508) and the current clock cycle is an idle cycle (510) (as illustrated by cycles 304, 308, etc. in FIG. 3*a*), the sequence of pending memory read-requests residing in the FIFO may be analyzed to determine which pending memory read request(s) would result in a page miss and which pending memory read-request(s) would result in a page hit if they reached the memory controller without any additional memory commands also being sent to the memory controller. An additional memory command may then be determined (516) and transmitted to the memory controller (518). In one embodiment, 516 is performed by obtaining the additional memory command from a lookup table (as shown in FIG. 5). The additional memory command obtained from the lookup table may represent an optimal additional memory command for the current idle cycle, where sending the optimal additional memory command to the memory controller and the memory controller processing the optimal additional memory command may reduce to a lowest possible number the number of cycles required by the memory controller to process all the pending read-requests it receives from the FIFO.

It should be noted that in case the head of the FIFO (the element next to be processed from the FIFO) contained a memory-read request that resulted in a page-miss, then standard page-miss processing would have to take place and the FIFO may then be stalled.

If the memory controller is ready to receive commands (508) and the current clock cycle is not an idle cycle (510), the next pending memory read-request from the FIFO may be transmitted to the memory controller (512). The additional memory command may be a DDR SDRAM memory precharge or a DDR SDRAM memory activate. Contents of the lookup table may be derived for each unique sequence of contiguous pending memory read-requests that may reside in the FIFO, with each unique sequence defined by which pending memory read request(s) of the unique sequence would result in a page miss and which pending memory read-request(s) of the possible sequence would result in a page hit if they reached the memory controller without any additional memory commands also being sent to the memory controller. For each unique sequence an exhaustive search may be performed, where every possible combination of inputs and outputs is examined, and the one resulting in the smallest number of clock cycles required by the memory controller to process all the pending memory read-requests in the unique sequence is selected and stored in the lookup table as an optimal additional memory command corresponding to the respective unique sequence.

Thus, various embodiments of the systems and methods described above may facilitate optimal use of interleaved memory systems, such as a DDR SDRAM system, when performing high bandwidth read operations. An optimizer module may intercept memory read-requests originating from a host system requesting memory data, and store the read-requests in a FIFO. Read-requests may arrive during non-consecutive clock cycles, with idle clock cycles in-between. During each idle clock cycle, the optimizer module may analyze the read-requests currently in the FIFO, and may generate and transmit an additional memory command to the memory controller based on which memory banks and which memory rows are currently active. These additional memory commands, which may be precharge or activate commands, when processed by the memory controller, may reduce the number of page misses resulting from the read-requests processed by the memory controller.

Numerous variations and modifications will become apparent to those skilled in the art once the above disclosure is fully appreciated. It is intended that the following claims be interpreted to embrace all such variations and modifications.

I claim:

1. A system comprising:
 a memory controller;
 a module coupled to the memory controller; and
 a buffer coupled to the module configured to receive and store read-requests;
 wherein the module is operable to:
  transmit read-requests from the buffer to the memory controller;
  analyze a current sequence of read-requests stored in the buffer to determine and generate an optimized set of one or more additional commands to insert after one or more corresponding selected read-requests in the sequence of read-requests that minimizes the number of clock cycles required to process the current sequence of read-requests; and
  transmit each additional command of the optimized set to the memory controller during one or more idle cycles after the corresponding selected read-request, wherein idle cycles correspond to cycles used to read data in response to each read-request; and
 wherein the memory controller is operable to process the additional commands.

2. The system of claim 1, wherein the module is further operable to determine and store in a lookup table an optimized set of one or more additional commands for each of a plurality of possible sequences of read-request, and wherein the lookup table is stored in a memory coupled to the module.

3. The system of claim 1, further comprising a memory, wherein the memory comprises DDR SDRAM devices.

4. The system of claim 3, wherein each of the one or more additional memory commands comprises one of:
 a DDR SDRAM precharge command; or
 a DDR SDRAM activate command.

5. The system of claim 2, wherein the module is operable to determine the optimized set of the one or more additional memory commands based on information obtained from the lookup table.

6. The system of claim 5, wherein the module is operable to determine the optimized set of the one or more additional memory commands when there is more than one pending read-request in the buffer.

7. The system of claim 1, wherein the memory controller is operable to suspend the transmitting of pending read-requests and any additional memory commands by the module during a time period in which the memory controller is servicing a page miss.

8. The system of claim 1, wherein the memory controller is operable to conditionally not process any additional memory commands.

9. A method comprising:
 receiving and storing a sequence of two or more read-requests in a buffer;
 transmitting a pending read-request from the buffer to a memory controller; and
 conditionally generating and transmitting one or more additional commands to the memory controller during one or more idle cycles after transmitting the pending read request and before transmitting a next pending read-request to the memory controller, wherein the one or more idle cycles correspond to cycles used to read data in response to the pending read-request;

wherein said conditionally generating comprises analyzing the sequence of read-requests stored in the buffer to determine and generate an optimized set of one or more additional commands to insert after one or more selected read-requests in the sequence of read-requests that minimizes the number of clock cycles required to process the sequence of read-requests.

10. The method of claim 9, wherein the memory controller is coupled to a memory comprising one or more interleaved memory devices.

11. The method of claim 10, wherein the one or more interleaved memory devices are DDR SDRAM devices.

12. The method of claim 11, wherein the one or more additional memory commands comprise one or more of:
   a DDR SDRAM activate command, or
   a DDR SDRAM precharge command.

13. The method of claim 9, wherein said transmitting a next pending read-request is performed in the order in which the read-requests were stored.

14. The method of claim 9, wherein said generating and transmitting the one or more additional memory commands is performed in response to a determination that transmitting one or more of the read-requests in a sequence of pending read-requests to the memory controller without performing said transmitting the additional memory commands would result in one or more page misses.

15. The method of claim 14, wherein said determination is performed by:
   obtaining a list of currently active banks and currently active rows of a memory coupled to the memory controller; and
   ascertaining which respective bank and/or which respective row is targeted by each pending read-request in the sequence.

16. The method of claim 9, further comprising the memory controller processing the one or more additional memory commands.

17. The method of claim 16, wherein said processing decreases a total number of clock cycles required by the memory controller to process a sequence of pending read-requests.

18. The method of claim 9, wherein said generating one of the one or more additional memory commands further comprises:
   selecting an additional memory command from an entry in a lookup table;
   wherein each entry of the lookup table comprises an optimal additional memory command corresponding to a respective sequence of pending read-requests.

19. The method of claim 18, wherein each respective sequence of pending read-requests predicts a unique sequence of read responses, and wherein a read response comprises one of a page miss or a page hit.

20. The method of claim 18, wherein each entry of the lookup table is generated by performing one or more of the following:
   considering a subset of all possible additional memory commands that can be generated for a sequence of pending memory read-requests; and
   selecting an optimal subset of additional memory commands from the set of all possible additional memory commands;
   wherein a sending of the optimal subset of additional memory commands to the memory controller and a processing of the additional memory commands by the memory controller minimizes the total number of clock cycles required by the memory controller to process the sequence of pending read-requests.

21. The method of claim 9, wherein said analyzing occurs during an idle cycle.

22. The system of claim 1, wherein said analyze the current sequence occurs during an idle cycle.

* * * * *